(12) United States Patent
Mikolajick

(10) Patent No.: US 7,273,786 B2
(45) Date of Patent: Sep. 25, 2007

(54) METHOD FOR FABRICATING A SEMICONDUCTOR MEMORY CELL

(75) Inventor: Thomas Mikolajick, Dresden (DE)

(73) Assignee: Infineon Technologies AG, Munich (DE)

(*) Notice: Subject to any disclaimer, the term of this patent is extended or adjusted under 35 U.S.C. 154(b) by 266 days.

(21) Appl. No.: 11/021,626

(22) Filed: Dec. 22, 2004

(65) Prior Publication Data

US 2005/0141271 A1    Jun. 30, 2005

Related U.S. Application Data

(62) Division of application No. 10/283,856, filed on Oct. 30, 2002, now abandoned.

(30) Foreign Application Priority Data

Oct. 30, 2001    (DE) ................................. 101 53 384

(51) Int. Cl.
*H01L 21/336*    (2006.01)
(52) U.S. Cl. ....................................... 438/270; 438/272
(58) Field of Classification Search ........ 438/262–265, 438/270, 283
See application file for complete search history.

(56) References Cited

U.S. PATENT DOCUMENTS

| | | | | |
|---|---|---|---|---|
| 5,887,243 | A * | 3/1999 | Harvey et al. | 725/136 |
| 5,999,453 | A | 12/1999 | Kawata | |
| 6,011,725 | A | 1/2000 | Eitan | |
| 6,281,545 | B1 | 8/2001 | Liang et al. | |
| 6,465,836 | B2 * | 10/2002 | Lin et al. | 257/315 |
| 6,762,092 | B2 * | 7/2004 | Yuan et al. | 438/257 |
| 6,778,441 | B2 * | 8/2004 | Forbes et al. | 365/185.26 |
| 2003/0042528 | A1 * | 3/2003 | Forbes | 257/315 |

* cited by examiner

*Primary Examiner*—Hsien-Ming Lee
(74) *Attorney, Agent, or Firm*—Laurence A. Greenberg; Werner H. Stemer; Ralph E. Locher

(57) ABSTRACT

In order to be able to store information in a non-volatile fashion as compactly and as flexibly as possible in a semiconductor memory cell, the original gate region of a conventional memory transistor is removed, and a memory gate configuration having a plurality of memory gates that are spatially separate from one another and that are electrically insulated with respect to one another is formed.

37 Claims, 4 Drawing Sheets

METHOD FOR FABRICATING A SEMICONDUCTOR MEMORY CELL

CROSS-REFERENCE TO RELATED APPLICATIONS

This is a divisional application of application Ser. No. 10/283,856, filed Oct. 30, 2002 now abandoned; the application also claims the priority, under 35 U.S.C. §119, of German patent application No. 101 53 384.5, filed Oct. 30, 2001; the prior applications are herewith incorporated by reference in their entirety.

BACKGROUND OF THE INVENTION

Field of the Invention

The invention relates to a method for fabricating a semiconductor memory cell.

In further developing semiconductor memory devices that are based on non-volatile memory mechanisms, the principles of the so-called non-volatile floating gate memory cell and of the charge trapping cell have also been developed. Such semiconductor memory cells for storing non-volatile information have a memory gate configuration, a source/drain configuration, and a control gate configuration. The memory gate configuration serves for storing the actual information, while the source/drain configuration is designed for accessing the memory gate configuration and thus for accessing the respective information. The control gate configuration is designed for controlling this access to the memory gate configuration and to the information.

What is disadvantageous about known semiconductor memory devices is that from a structural and production engineering standpoint, the fundamental concept on which the memory cells contained in the memory devices and the corresponding fabrication methods for producing semiconductor memory devices or memory cells is based on providing a single binary information unit in each individual memory cell. Each memory cell and thus each memory location are thus occupied only singularly with information and is designed accordingly.

SUMMARY OF THE INVENTION

It is accordingly an object of the invention to provide a method for fabricating a semiconductor memory cell that overcomes the above-mentioned disadvantages of the prior art methods of this general type.

In particular, it is an object of the invention to provide a method for fabricating a semiconductor memory cell, that in a particularly simple manner, enables a particularly high information density to be obtained and enables the information to be modified and retrieved in a particularly reliable manner.

With the foregoing and other objects in view there is provided, in accordance with the invention, a semiconductor memory cell for non-volatile information storage. The semiconductor memory cell includes: a memory gate configuration designed for non-volatile information storage; a source/drain configuration designed for accessing the memory gate configuration; and a control gate configuration designed for controlling access to the memory gate configuration. The memory gate configuration has a plurality of memory gate regions. Each of the plurality of the memory gate regions is designed for essentially independent information storage such that a corresponding plurality of information units can be stored independently of one another.

The inventive semiconductor memory cell for non-volatile information storage is characterized by providing the memory gate configuration with a plurality of memory gates, and by designing each of the memory gates for essentially independent information storage. As a result, a corresponding plurality of information units, in particular binary bits, can be stored independently in the memory cell. The terms memory gate and memory gate region are used synonymously hereinafter.

Thus, in contrast to the prior art, the invention departs from the one-bit concept, and consequently, the inventive semiconductor memory cell is designed for storing a plurality of information units, in particular binary bits or the like. This is realized by virtue of the fact that, in contrast to the prior art semiconductor memory cell, the inventive memory gate configuration is designed with a plurality of memory gates. In this case, it is provided that each of the memory gates is designed for separate and independent information storage independently of the other memory gates.

Consequently, by way of example, a respective bit can be written and retrieved, in accordance with an impressed charge or potential state, in each of the memory gates.

Each memory gate can also be designed for taking up more than two charge and/or potential states, so that the information density per semiconductor memory cell is increased further in that e.g. each memory gate is designed for storing more than one bit.

It is particularly advantageous if the memory gate regions are designed such that they are, pairwise, spatially separate from one another and/or electrically insulated from one another. This is because, at locations that are spatially separate from one another, different information contents can then be read out, written in, or influenced in some other way, in a particularly simple manner, independently, in a manner isolated from one another.

The structure of the inventive semiconductor gate memory cell is configured particularly simply if, in accordance with a particularly preferred embodiment, the control gate configuration has a common control gate and access to the memory gates and the information state contained therein can be jointly controlled by the one common control gate. The initial organizational combination to a common control gate results in a particularly simple control of the access to the information that will be stored in the memory gate. The initially organizational and sequence-technical assignment of the memory gates to a common control gate will advantageously also be represented in a structural or spatial assignment, in particular, in a particular spatial proximity of the assigned floating gates with respect to the control gate.

A further simplification of the inventive semiconductor memory cell results if the source/drain configuration has a plurality of source/drain regions, the number of source/drain regions of the source/drain configuration corresponds to the number of memory gates or memory gate regions of the memory gate configuration, and a respective memory gate or a respective memory gate region is assigned precisely one respective source/drain region in such a way that all of the memory gates or memory gate regions can be accessed independently of one another.

With regard to a particularly simple fabrication procedure and also with regard to a corresponding functional reliability, the geometrical and/or material properties of the memory gates are designed essential identically.

For the reliability of the inventive semiconductor memory cell, on the other hand, the memory gates are arranged and designed in a manner essentially electrically insulated from one another, from the control gate and from the source/drain regions.

In accordance with another embodiment of the inventive semiconductor memory cell, the memory gate regions are designed as floating gate regions or floating gates, so that the semiconductor memory cell functions as a floating gate memory cell.

In this case, the memory gate regions are designed and arranged as floating gates in an essentially capacitively coupled manner in the memory cell.

Furthermore, the memory gate regions are designed as floating gates made of a polysilicon material, polycide, metal and/or the like.

In another embodiment of the inventive semiconductor memory cell, the memory gate regions are designed as charge trapping regions, charge trapping layers, charge trapping gate regions or charge trapping gates, so that the inventive semiconductor memory cell functions as a charge trapping memory cell.

In this case, the charge trapping gates are composed of a material or have such a material in which charge trapping states can be formed. In particular, the material is an insulator which has or which can form a sufficient number of defects which, for their part, can be occupied by electrons and/or by holes or the like.

Moreover, it is provided that the charge trapping gates are composed of silicon nitride, $ZrO_2$, $Al_2O_3$, $Ta_2O_5$, $HfO_2$ and/or the like or have such a material. In this case, it is possible in addition to provide an insulation layer toward the control gate, toward the source/drain and/or channel region, given the use of nitride, e.g. in the form of an ONO structure, NO structure.

In another embodiment of the inventive semiconductor memory cell, each memory gate region or each memory gate can assume a plurality of charge and/or potential states, in particular two, which correspond to information states assigned to the memory gate regions or memory gates.

It is further preferred that the control gate is arranged and designed in a manner essentially electrically insulated from the memory gates and from the source/drain regions.

In accordance with another embodiment of the inventive semiconductor memory cell, the control gate is composed of a polysilicon material, polycide, metal and/or the like.

In order to realize the assignment between the memory gates and with respect to the common control gate, in accordance with a preferred embodiment of the inventive semiconductor memory cell, the memory gates and the control gate are in each case designed in direct spatial proximity to one another. Respective intermediate insulation regions are provided, in particular, in each case an intermediate dielectric is provided between the memory gates and the control gate.

The intermediate dielectric is also referred to, if appropriate, as an interpoly dielectric and may be e.g. an NO or ONO structure, i.e. a structure with a configuration including nitride/oxide or oxide/nitride/oxide, respectively. However, pure silicon dioxide is also possible.

It is furthermore preferred that each memory gate is designed and arranged in direct spatial proximity to a respectively assigned source/drain region. As a result, in particular, a spatial or areal overlap is formed between the memory gates and the source/drain regions.

In accordance with another embodiment of the inventive semiconductor memory cell, an insulation region, in particular in the form of a silicon dioxide material, is provided between the respective memory gate and the source/drain regions.

With the foregoing and other objects in view there is provided, in accordance with the invention, an inventive semiconductor memory device having a plurality of the inventive memory cells for non-volatile information storage.

In a particularly preferred embodiment, adjacent memory cells use at least some of the control gates as common control gates.

The inventive method for fabricating a semiconductor memory cell for non-volatile information storage is presented below. A fabrication method of the generic type is used as a basis in this case. In the case of this method of the generic type, a memory gate configuration, a source/drain configuration and a control gate configuration are provided. The memory gate configuration is designed for the actual information storage. The source/drain configuration is designed for access to the memory gate configuration. The control gate configuration is designed for controlling the access to the memory gate configuration and to the information contained therein.

The inventive method for fabricating a semiconductor memory cell is characterized in that the memory gate configuration is designed with a plurality of memory gates or memory gate regions, in that each of the memory gates is designed for essentially independent information storage, and in that, as a result, a corresponding plurality of information units, in particular binary bits or the like, can be stored independently of one another in the memory cell.

Preferably, the memory gate regions or memory gates are designed such that they are, pairwise, spatially separate from one another and/or electrically insulated from one another.

In a particularly preferred embodiment of the fabrication method, the control gate configuration has a common control gate, and access to the memory gates is jointly controllable by the common control gate.

On the other hand, the source/drain configuration is formed with a number of source/drain regions. The number of the source/drain regions formed corresponds to the plurality of memory gate regions provided, and a respective memory gate region is assigned to precisely one respective source/drain region, so that, as a result, all of the memory gates or memory gate regions can be accessed independently of one another via the plurality of source/drain regions.

In a particularly preferred embodiment of the fabrication method, in each case the memory gates are designed essentially identically with regard to their geometrical and/or material properties.

In another embodiment of the method, the memory gate regions are designed as floating gate regions or floating gates, so that the semiconductor memory device functions as a floating gate memory cell.

Furthermore, in this case the memory gate regions are designed and arranged as floating gates in an essentially capacitively coupled manner in the inventive semiconductor memory cell.

Furthermore, it is advantageous in this case if the memory gate regions are designed as floating gates made of a polysilicon material, polycide, metal and/or the like.

On the other hand, in accordance with another advantageous embodiment of the method, the memory gate regions can be designed as charge trapping gate regions or charge trapping gates, so that the inventive semiconductor memory cell functions as a charge trapping memory cell.

In this case, it is then advantageous if the charge trapping gates are composed of a material or have such a material in which charge trapping states can be formed, in particular an insulator which has or can form a sufficient number of defects which can be occupied by electrons and/or by holes.

In this case, it is furthermore advantageous if the charge trapping gates are formed with silicon nitride, e.g. with an ONO structure, NO structure, including $ZrO_2$, $Al_2O_3$, $Ta_2O_5$, $HfO_2$ and/or the like.

In a further advantageous embodiment of the method, the memory gate regions or memory gates are designed in such a way that each of the memory gate regions can assume a plurality of charge and/or potential states, in particular two, which correspond to information states assigned to the memory gate regions.

It is furthermore preferred that the memory gates and/or the control gate are arranged and designed in a manner essentially electrically insulated from one another, from the control gate and/or from the memory gates and from the source/drain regions.

The control gate is preferably formed from a polysilicon material, polycide, metal and/or the like. It is advantageous to design the control gate in each case with low impedance. By contrast, the memory gates can also have high impedance.

In order to realize the assignment between the respective floating gates and the control gate, the memory gates and the control gate are formed in direct spatial proximity to one another, and in this case, in particular, an intermediate insulation region is provided in each case, in particular an intermediate dielectric.

Preferably, each memory gate is designed or arranged in direct spatial proximity to the first source/drain region. As a result, in particular, a spatial or areal overlap is formed between the memory gates and the source/drain regions. Preferably, an insulation region, in particular in the form of a silicon dioxide material, is furthermore formed between the respective memory gates and the respective source/drain region.

The previous characterizing features of the fabrication method represent, in part the structural features of the inventive semiconductor memory cell that will be formed. However, different configurations are furthermore conceivable during the fabrication.

In a particularly advantageous embodiment of the inventive fabrication method, it is provided that first a conventional MOSFET is formed, in particular using self-aligning or self-aligned polysilicon gate technology. In this case, the original gate of the conventional MOSFET is then subsequently removed to create a recess in an insulation region embedding the original gate. Afterward, in the recess, the memory gate configuration with the plurality of memory gate regions or memory gates is then formed, and is embedded in an insulated manner and provided with a control gate configuration.

In a further advantageous embodiment of the method, it is provided that, for that purpose, first the original gate of the conventional MOSFET is embedded in an insulation region, preferably made of $SiO_2$, and then a planarization step with a stop on the level of the surface region of the original gate of the conventional MOSFET subsequently takes place.

For more concrete implementation of the method, it is advantageously provided that the original gate of the conventional MOSFET is removed, to be precise preferably by masked etching back. In this case, in particular, a recess is formed in the insulation region, preferably in a region above and between the source/drain regions of the original MOSFET.

Then, a spacer layer is optionally deposited conformally in such a way that the recess is filled—silicon nitride, an NO structure and/or the like being used.

In a further preferred embodiment of the fabrication method, at least one material layer for the memory gates or memory gate regions of the memory gate configuration is deposited conformally in such a way that the recess is lined, in particular in edge regions thereof.

Furthermore, it is advantageous if for forming floating gates, an electrically conductive material is used for the material layer of the memory gates or memory gate regions. On the other hand, in an advantageous manner, for forming charge trapping gates or charge trapping gate regions, an electrically insulating material is used for the material layer of the memory gates or memory gate regions, to be precise a material which, in particular, has a high density of so-called traps or can form such traps.

In a further preferred embodiment of the fabrication method, it is provided that in order to form the memory gates, the material region for the memory gates is patterned by anisotropic etching back, and that in this case, in particular, the memory gates remain as spatially separate parts of the material layer for the memory gates in the edge region of the recess.

When an electrically conductive floating gate is used, a masked etching is provided for isolating the initially contiguous floating gate regions.

Furthermore, it is advantageous if at least one insulation layer is then deposited, in particular conformally, such that the memory gate regions or memory gates are embedded by the insulation layer.

Afterward, a material layer for the control gate configuration is then advantageously deposited and patterned, in particular, the recess in the insulation region is filled.

The above-described and further aspects of the present invention are also explained on the basis of the remarks below:

In flash or EEPROM memory cells, it is usually possible to store a plurality of bits per cell by storing different charge states. Recent developments also utilize cells in which a respective bit is stored at spatially separate locations. A new method for fabricating an EEPROM or flash cell, in which two bits are stored at locations that are spatially separate from one another, is presented in the context of this explanation of the invention.

Storing two bits in one flash cell has been realized heretofore either by using a continuous $Si_3N_4$ layer (NROM concept) or by storing a plurality of charge states in one cell. In production, floating gate cells have heretofore exclusively stored a plurality of charge states in a floating gate for storing a plurality of bits in one cell. It is also known to form a floating gate memory cell for storing two bits at different locations of the memory cell.

The inventive fabrication of spacers makes it possible to form two bits at different locations of a floating gate or charge trapping memory cell. In contrast to the known cells in which charge is stored either in a continuous layer through localized introduction of charge carriers in traps or in floating gate spacer regions lying next to the control gate, here spacers are provided below the control gate. This is achieved by after fabricating a conventional n-channel MOS transistor, removing the polysilicon gate and then fabricating floating gate or charge trapping spacers, and after the applying an insulation dielectric, applying the control gate.

Advantages appertaining to the realization with a floating gate reside in the better coupling of the control gate to the floating gate regions in comparison with the known method.

The advantage appertaining to the charge trapping embodiment resides in the structure of the charge trapping layer. Programming of regions that are far away from the locations to be programmed is thus not possible, and this allows one to expect that an improved cycle stability will be obtained.

One inventive idea lies in first fabricating a conventional n-channel transistor (if appropriate with additional implantation steps) and then removing the gate. This enables the active memory regions to be fabricated in a structured manner in the region of the transistor.

The inventive semiconductor memory cell is also called a replacement gate memory cell or an exchange gate memory cell. This cell includes a source region and a drain region, two memory regions and also a control gate. This memory cell is suitable for being incorporated into a virtual ground NOR array, but the cell can be used—with a slight modification—in any NOR-like array architecture.

2-Bit Replacement Gate Memory Cell Architectures:

In principle, the memory cell can be integrated into all known NOR-like architectures. Preference is given to the virtual ground NOR architecture (as in the case of the NROM) since this is particularly space-saving. In this architecture, the diffusion tracks are used as bit lines. The latter may, if appropriate, be short-circuited by metal interconnects in an upper plane in order to reduce the resistance. In this case, contacts have to be present only for every n-th cell (n>=1). A NOR architecture with metal bit lines is also possible as an alternative, but a source line must then be available for each bit line in order to utilize the 2-bit capability of the cell.

Charge can be stored in each of the two memory layer regions.

The charge can be introduced either by:
the injection of hot electrons (preferred method as in the case of NROM) or by
tunneling from the respective adjoining drain or source region into the memory layer.

The last-mentioned method cannot, however, be realized in conjunction with a virtual ground architecture (preferred embodiment) since then two bits would be programmed in parallel in each case.

The charge can be removed from the memory layer either by:
the injection of hot holes (preferred method as in the case of NROM) or by
tunneling to the channel region.

During reading, the end of the memory cell that is to be read forms the source, since the threshold voltage of the cell reacts very much more greatly to a charge in the vicinity of the source given sufficiently high drain voltage.

For fabricating a 2-bit replacement gate memory cell the following sequences are conceivable:
Fabricating a conventional NMOS transistor using self-aligning poly-gate technology (prior art); the source and drain implantations and also the well doping were adapted to the requirements, if appropriate, by using additional implantation masks.
An insulation oxide is subsequently deposited.
The planarization of the insulation oxide with a stop on the polysilicon gate.
Masked etching-back of the polysilicon; the polysilicon remains in the case of the CMOS transistors in the periphery. Optionally, the gate oxide can also be etched and then a new tunnel oxide can be grown.
Optionally, first a spacer made of silicon nitride or a nitride/oxide double layer can also be introduced (fabrication analogous to the next two steps, which can later be used for fabricating self-aligned contacts). If appropriate, this necessitates the adaptation of the doping by using an additional heat treatment.
The deposition of the memory layer. Two embodiments are conceivable here:

1. The deposition of a conductive layer. Polysilicon is used in the preferred embodiment of this variant of the invention, or 2. The deposition of an insulating layer with a high density of traps. Silicon nitride is used in the preferred embodiment of this variant.

Anisotropic etching back and masked isotropic etching of the memory layer. The masked etching serves for isolating the memory regions of different cells, for removing the memory material from the transistors in the periphery, and in the case of floating gates, for isolating the two memory gates of a cell.

The deposition of a thin insulation oxide. This may also involve a multilayer including a plurality of dielectrics (preferably ONO) which can also be fabricated from a combination of deposition and thermal oxidation.

ONO is preferably used in the variant of the invention with a polysilicon memory layer, and silicon dioxide is preferably used in the variant with a silicon nitride memory layer.

The masked removal of the insulation dielectric in the periphery (not illustrated).

The deposition of the gate layer (polysilicon, polycide, metal or a layer sequence including polysilicon and silicide or metal).

In the periphery, this layer or layer sequence can be used together with the poysilicon that is initially present as a gate electrode. As an alternative, the layer in the periphery can also be removed.

Patterning the polysilicon.

In the preferred embodiment (virtual ground architecture), the polysilicon is patterned in tracks running parallel to the plane of the drawing. Patterning in tracks perpendicular to the plane of the drawing is also possible in other architectures. This can be effected particularly advantageously by CMP (Chemical Mechanical Polishing) polishing of the gate material with a stop on the insulation oxide (illustrated case). In the last-mentioned case, the optional nitride spacer between steps 3 and 4 may enable the fabrication of self-aligned contacts. The last-mentioned variant of CMP planarization is also suitable, in particular, for integrating a metal control gate electrode.

Other features which are considered as characteristic for the invention are set forth in the appended claims.

Although the invention is illustrated and described herein as embodied in a method for fabricating a semiconductor memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic and lateral crosssectional view of the starting point for performing an embodiment of the inventive method for fabricating an inventive semiconductor memory cell;

FIG. 2 is a diagrammatic and lateral crosssectional view of an intermediate state occurring during the method of fabrication of an inventive semiconductor memory cell in accordance with one particular embodiment of the present invention;

FIG. 3 is a diagrammatic and lateral cross-sectional view of a further intermediate state occurring during the method of fabrication of an inventive semiconductor memory cell in accordance with one particular embodiment of the present invention;

FIG. 4 is a diagrammatic and lateral crosssectional view of a further intermediate state occurring during the method of fabrication of an inventive semiconductor memory cell in accordance with one particular embodiment of the present invention;

FIG. 5 is a diagrammatic and lateral crosssectional view of still a further intermediate state occurring during the method of fabrication of an inventive semiconductor memory cell in accordance with one particular embodiment of the present invention;

FIG. 6 is a diagrammatic and lateral crosssectional view of a further intermediate state wherein a further insulation region has been formed on the device of FIG. 5;

FIG. 7 is a diagrammatic and lateral crosssectional view of still a further intermediate state occurring during the method of fabrication of an inventive semiconductor memory cell in accordance with one particular embodiment of the present invention; and FIG. 8 is a diagrammatic and lateral crosssectional view of an inventive semiconductor memory cell fabricated using a method in accordance with one particular embodiment of the present invention.

DESCRIPTION OF THE PREFERRED EMBODIMENTS

In the figures described below, identical reference symbols always designate identical elements, and therefore, a detailed description is not given for every occurrence.

Figure 1:
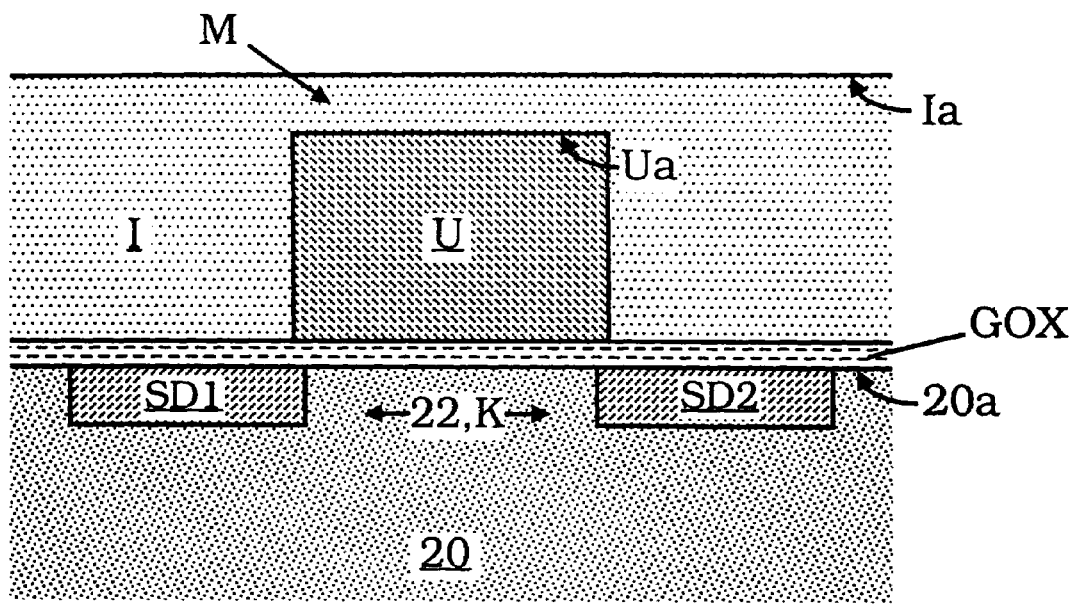
FIGS. 1-8 are diagrammatic lateral crosssectional views of intermediate states of a semiconductor memory cell that are reached in an exemplary embodiment of an inventive fabrication method. More particularly.

FIG. 1 shows a diagrammatic and lateral cross-sectional view of the starting point for performing an embodiment of the inventive method for fabricating an inventive semiconductor memory cell. This starting point consists essentially of fabricating a standard MOSFET in a semiconductor substrate 20 or the like. First and second source/drain regions SD1 and SD2 are formed in the semiconductor substrate 20, and in particular, in the surface region 20a thereof. An intermediate region 22 is provided in the semiconductor substrate between the source/drain regions SD1 and SD2. This intermediate region 22 functions as channel region K. A so-called gate oxide GOX is formed on the surface region 22a of the semiconductor substrate 20. This gate oxide GOX terminates to directly touch the free surface region 20a of the semiconductor substrate 20 and also the source/drain regions SD1 and SD2 that are embedded there and that terminate at the surface 22a. On the side of the gate oxide GOX that is remote from the intermediate region 22 or the channel region K, the so-called gate or original gate U of the original MOSFET M is formed, which, for its part, is embedded in an insulation layer or an insulation region I. This starting state is illustrated in FIG. 1.

Figure 2:
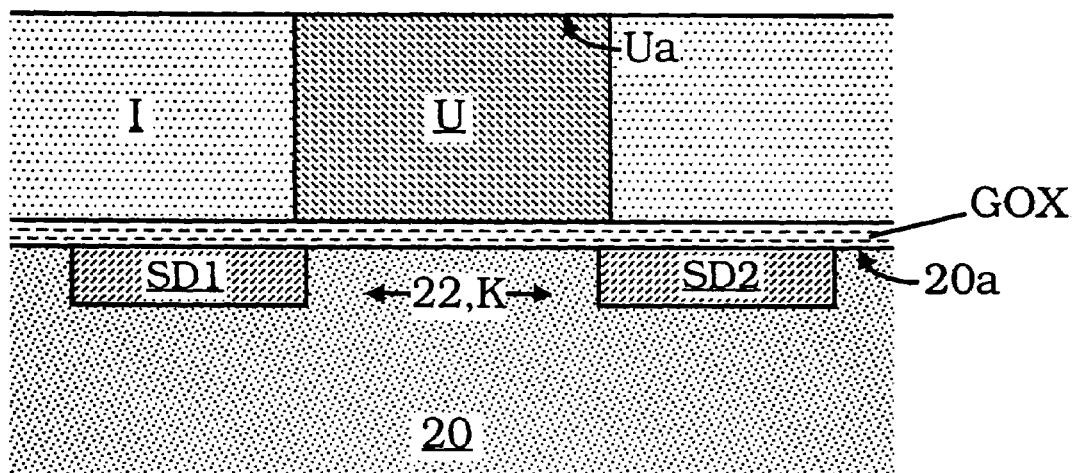

In the transition to the intermediate state shown in the lateral cross-sectional view of FIG. 2, the insulation layer I embedding the original gate U is then planarized to the level of the surface region Ua of the original gate U, so that the insulation layer or the insulation region I (oxide, for example) terminates flush with the level of the surface region Ua of the original polysilicon gate U.

Figure 3:
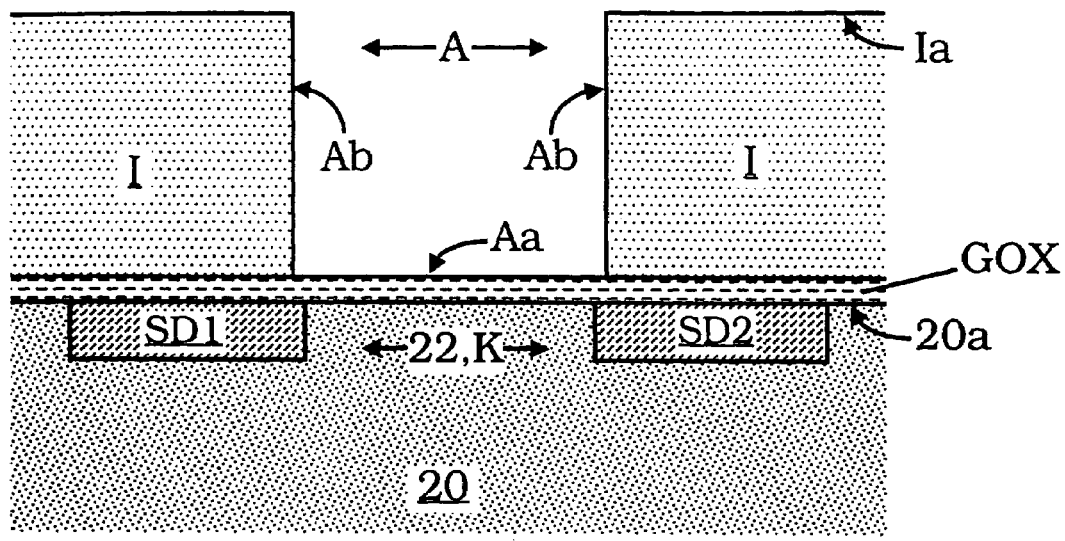

In the transition to the intermediate state shown in FIG. 3, the original gate U (a polysilicon gate) is then selectively removed, thereby forming a recess A in the insulation region I. This recess A has side wall regions or edge regions Ab and also a bottom region Aa.

Figure 4:
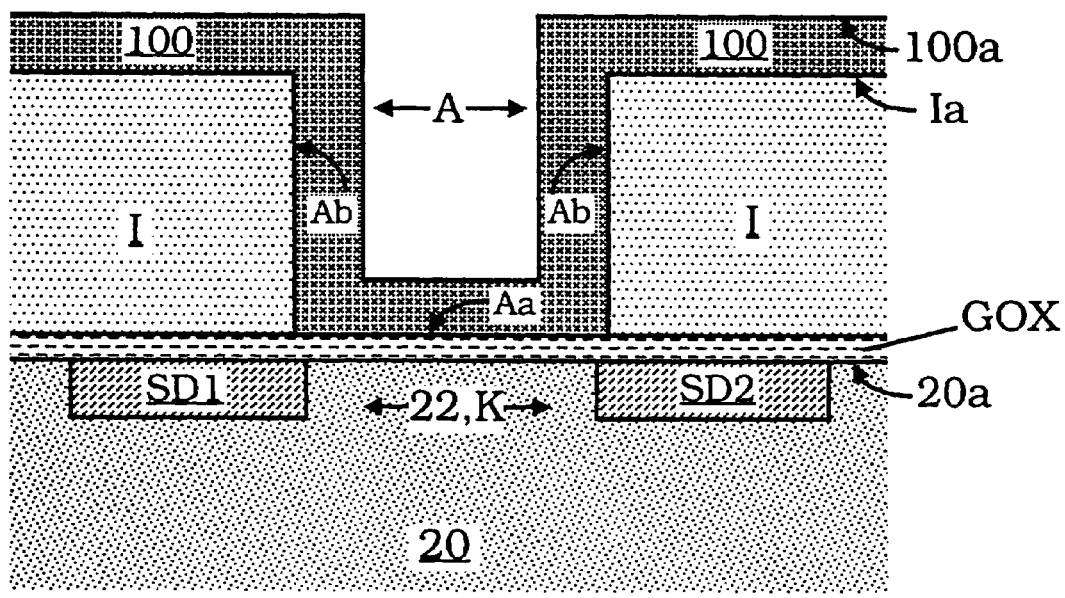

In the transition to the intermediate state shown in FIG. 4, a material layer 100 for producing the memory gate regions F1 and F2 (See FIG. 5) of the memory gate configuration F that will be formed is deposited in a conformal manner in such a way that at least the wall regions or edge regions Ab of the recess A in the insulation region I are covered. In this case, conductive materials, in particular polysilicon, polycide, metal or the like, are used for forming floating gates. When forming so-called charge trapping gate regions, by contrast, use is made essentially of an electrically insulating material that has a high density of defects or that can form such defects, which are then occupied by electrons or by holes or the like. In this case, silicon nitride or the like is preferred.

Figure 5:
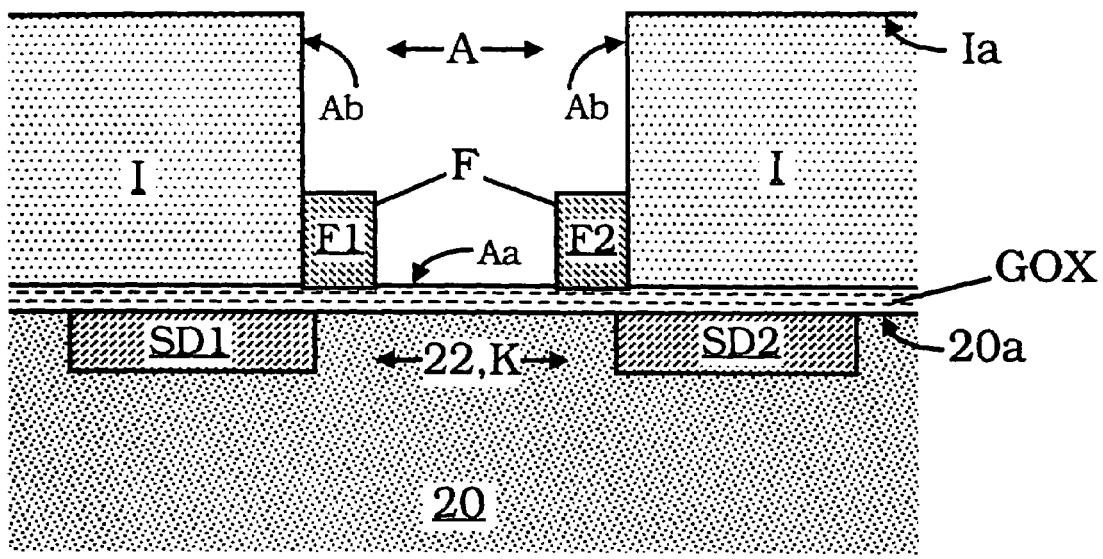

In the transition to the intermediate state shown in FIG. 5, the essentially contiguous region of the material region 100 for the memory gate regions F1 and F2 is then etched back anisotropically in order to form separate memory gate regions F1 and F2 in a form spatially separate from one another and essentially electrically insulated from one another. These memory gate regions F1 and F2, as an ensemble, form the memory gate configuration F of the inventive semiconductor memory cell 10. As is clearly revealed in FIG. 5, the memory gate regions F1 and F2 formed are spatially separated from one another by an intermediate region and are each situated at the junction between an edge region Ab and the bottom region Aa of the recess A that was formerly occupied by the original gate U of the conventional MOSFET M.

When using floating gates, it is additionally necessary to carry out a masked etching in order to isolate the floating gate regions in the planes parallel to the plane of the drawing.

This etching can be obviated in the case of charge trapping layers.

It is then optionally possible (not illustrated) to deposit an insulation region, preferably made of silicon dioxide, in the region between the memory regions either by thermal oxidation or by deposition and subsequent etching back to the level of the memory regions. This insulation region serves for preventing a charge exchange between channel and control gate during Fowler-Nordheim programming.

Figure 6:
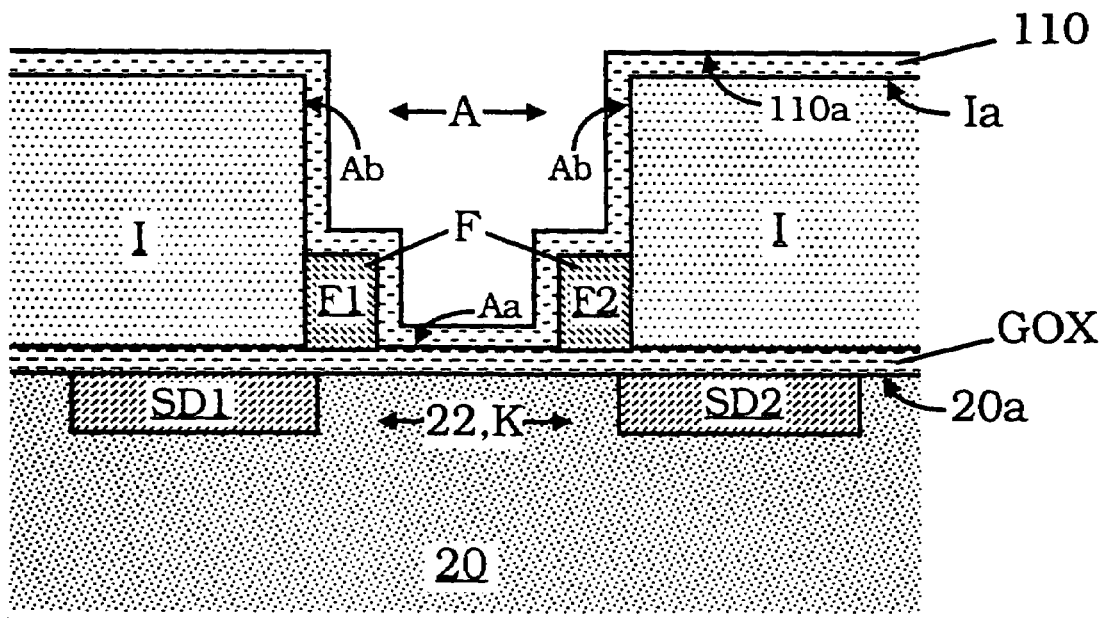
Figure 7:
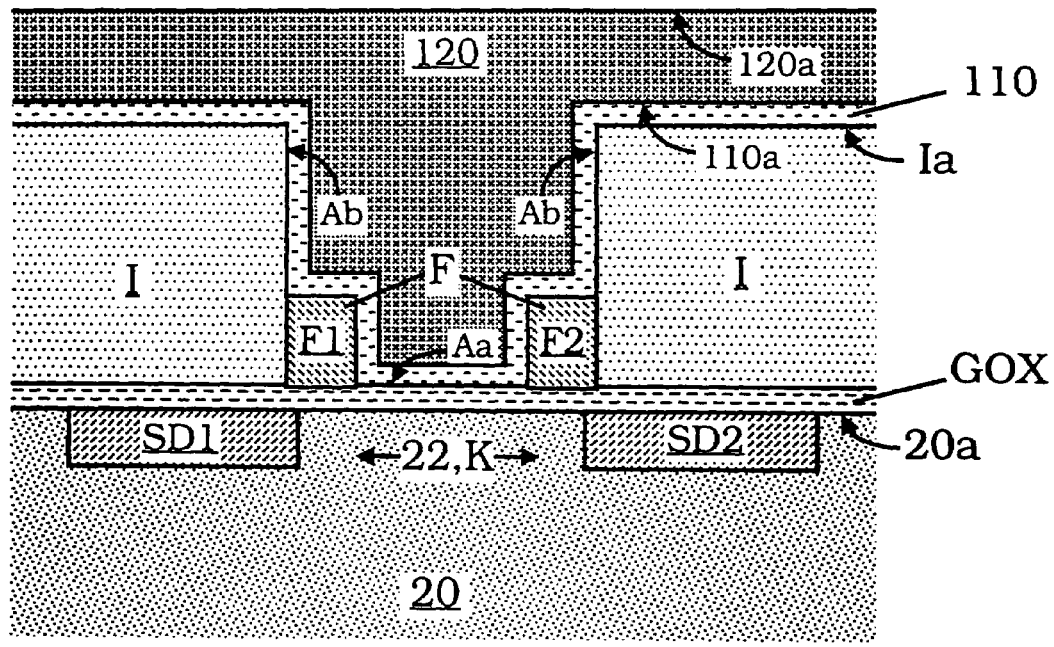
Figure 8:
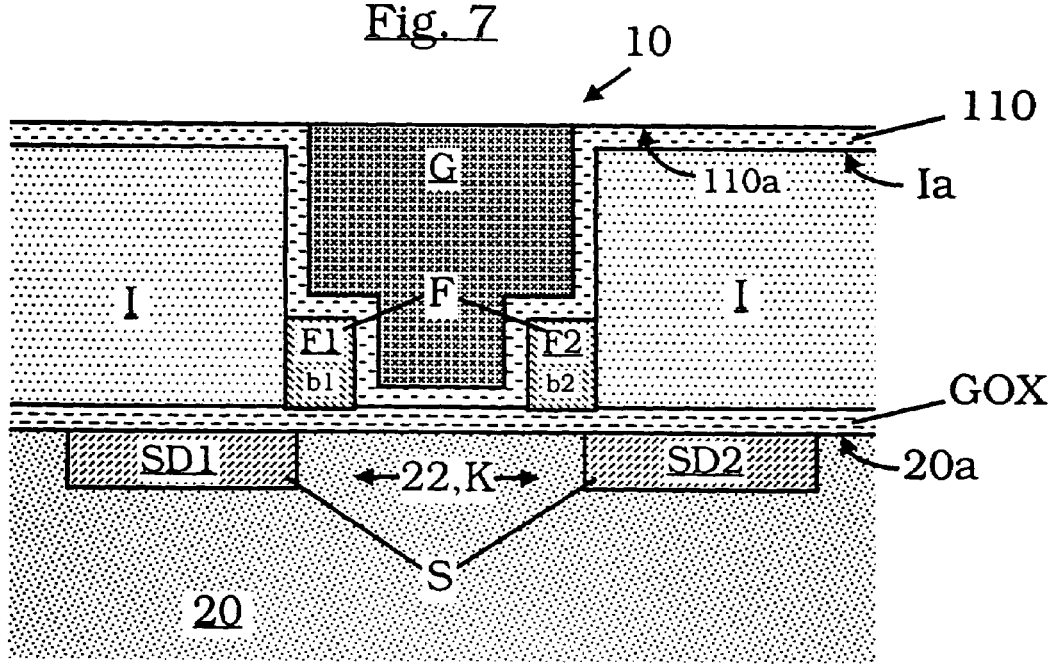

Afterward, as is illustrated in FIG. 6, a material layer 110 for a further insulation region is then formed. This insulation region 110 serves for electrically insulating the memory gate regions F1 and F2 from one another and for electrically insulating the memory gate regions F1 and F2 from the control gate G that will be formed later. FIG. 6 also reveals that part of the recess A of the original insulation region I still remains free after forming the memory gate regions F1 and F2 and after the essentially conformal deposition of the further insulation region 110. In the transition to the intermediate state shown in FIG. 7, this remaining recess A in the insulation region I is then filled with a material layer 120 for the control gate G that will be formed. The material layer 120 is then patterned, in the transition to the intermediate state shown in FIG. 8, by removing the material layer 120 for the control gate G and stopping on the surface level 110A of the further insulation region 110. As an alternative, etching back or masked etching is also conceivable, during which the remaining control gate regions are formed with wiring in the same step. FIG. 8 also shows that the recess A for the original gate U of the conventional MOSFET M is now filled by the memory gate regions F1 and F2, a corresponding insulation region 110 and the control gate G. Consequently, the original gate U has been replaced by a spatially separate plurality of memory gate regions F1 and F2 and the control gate G—a circumstance which, with regard to the inventive memory cell 10, also leads to the term replacement gate memory cell or exchange gate memory cell.

I claim:

1. A method for fabricating a semiconductor memory cell for nonvolatile information storage, the method which comprises:
   providing a memory gate configuration having a plurality of memory gate regions in which each one of the plurality of the memory gate regions is constructed for substantially independently storing information such that a corresponding plurality of information units can be stored independently of one another;
   providing a source/drain configuration constructed for accessing the memory gate configuration;
   providing a control gate configuration for controlling access to the memory gate configuration; and
   constructing the plurality of the memory gate regions to replace at least a part of an original gate of a conventional MOSFET, by:
      first, using self-aligning polysilicon technology to form a conventional MOSFET having an original gate embedded in an insulation region;
      second, removing the original gate of the MOSFET to create a recess in the insulation region embedding the original gate; and
      third, forming the plurality of the memory gate regions in the recess embedding the plurality of the memory gate regions in an insulating manner, and providing the control gate configuration.

2. The method according to claim 1, wherein the information units are binary bits.

3. The method according to claim 1, which comprises constructing the plurality of the memory gate regions to be pairwise, Spatially separate from one another.

4. The method according to claim 1, which comprises constructing the plurality of the memory gate regions to be electrically insulated from one another.

5. The method according to claim 1, which comprises providing the control gate configuration with a common control gate for jointly controlling access to the plurality of the memory gate regions.

6. The method according to claim 1, which comprises:
   providing the source/drain configuration with a plurality of source/drain regions present in a number corresponding to a number of the plurality of the memory gate regions; and
   assigning each one of the plurality of the source/drain regions to a respective one of the plurality of the memory gate regions such that the one of the plurality of the memory gate regions Can be accessed using the control gate configuration and the one of the plurality of the source/drain regions.

7. The method according to claim 1, which comprises constructing the plurality of the memory gate regions to have substantially identical geometrical properties.

8. The method according to claim 1, which comprises constructing the plurality of the memory gate regions to have substantially identical material properties.

9. The method according to claim 1, which comprises:
   providing the control gate configuration with a control gate and providing the Source/drain configuration with a plurality of source/drain regions; and
   configuring and constructing the plurality of the memory gate regions to be substantially electrically insulated from one another, from the control gate and from the plurality of the source/drain regions.

10. The method according to claim 1, which comprises constructing the plurality of the memory gate regions as floating gate regions or floating gates so that the semiconductor memory cell functions as a floating gate memory cell.

11. The method according to claim 10, which comprises constructing and configuring the plurality of the memory gate regions as floating gates being substantially capacitively coupled.

12. The method according to claim 1, which comprises constructing the plurality of the memory gate regions as floating gates made of a material selected from a group consisting of a polysilicon material, a polycide, and a metal.

13. The method according to claim 1, which comprises constructing the plurality of the memory gate regions as charge trapping gate regions or charge trapping gates so that the semiconductor memory cell functions as a charge trapping memory cell.

14. The method according to claim 13, which comprises:
   constructing the plurality of the memory gate regions as charge trapping gates formed with silicon nitride;
   providing the plurality of the memory gate regions with an ONO structure or an NO structure;
   further providing the plurality of the memory gate regions with a material selected from a group consisting of $ZrO_2$, $Al_2O_3$, $Ta_2O_5$, and $HfO_2$; and
   providing an insulation region between the charge trapping gates and a control gate of the control gate configuration.

15. The method according to claim 14, which comprises also providing the insulation region between the charge trapping gates and source/drain regions of the source/drain configuration and between the charge trapping gates and a channel region.

16. The method according to claim 1, which comprises:
   constructing the plurality of the memory gate regions as charge trapping gates so that the semiconductor memory cell functions as a charge trapping memory cell; and
   forming the charge trapping gates using a material in which charge trapping states can be formed.

17. The method according to claim 16, which comprises providing the material of the charge trapping gates as an insulator that has or that can form a sufficient number of defects that can be occupied by electrons and/or holes.

18. The method according to claim 1, which comprises constructing the plurality of the memory gate regions such that a plurality of charge and/or potential states can be assumed which correspond to information states assigned to the plurality of the memory gate regions.

19. The method according to claim 18, wherein the plurality of the charge and/or potential states is exactly two states.

20. The method according to claim 1, which comprises providing the control gate configuration with a control gate that is electrically insulated from the plurality of the memory gate regions and from source/drain regions of the source/drain configuration.

21. The method according to claim 1, which comprises providing the control gate configuration with a control gate formed from a material selected from a group consisting of a polysilicon material, a polycide, and a metal.

22. The method according to claim 1, which comprises:
providing the control gate configuration with a control gate;
configuring the plurality of the memory gate regions and the control gate in direct spatial proximity to one another; and
providing an intermediate insulation region between the control gate and the plurality of the memory gate regions.

23. The method according to claim 22, which comprises providing the intermediate insulation region as an intermediate dielectric.

24. The method according to claim 1, which comprises:
configuring each one of said plurality at said memory gate regions in direct spatial proximity to an assigned source/drain region such that a spatial overlap is formed between the one of said plurality of said memory gate regions and the assigned source/drain region; and
providing an insulation region between one of said plurality of said memory gate regions and the assigned source/drain region.

25. The method according to claim 24, which comprises forming the insulation region from silicon dioxide.

26. The method according to claim 1, which comprises constructing the plurality of the memory gate regions as spacer elements embedded in a recess of an insulation region.

27. A method for fabricating a semiconductor memory cell for nonvolatile information storage, the method which comprises:
first embedding an original gate of a conventional MOSFET in an insulation region, the original gate having a surface region defining a level;
second, performing a planarization step and stopping on the level of the surface region of the original gate;
providing a memory gate configuration having a plurality of memory gate regions in which each one of the plurality of the memory gate regions is constructed for substantially independently storing information such that a corresponding plurality of information units can be stored independently of one another;
providing a source/drain configuration constructed for accessing the memory gate configuration;
providing a control gate configuration for controlling access to the memory gate configuration; and
constructing the plurality of the memory gate regions to replace at least a part of an original gate of a conventional MOSFET.

28. The method according to claim 27, which comprises providing the insulation region as $SiO_2$.

29. The method according to claim 27, which comprises using a masked etching to remove the original gate of the conventional MOSFET and to thereby form a recess in the insulation region in a region above and between source/drain regions of the source/drain configuration.

30. The method according to claim 29, which comprises conformally depositing a spacer layer such that the recess is lined.

31. The method according to claim 30, which comprises providing the spacer layer as silicon nitride, an ONTO structure, or an NO structure.

32. The method according to claim 29, which comprises conformally depositing at least one material layer for producing the plurality of the memory gate regions such that edge regions of the recess are lined.

33. The method according to claim 32, which comprises:
in order to form floating gates, using an electrically conductive material for the material layer for producing the plurality of the memory gate regions;
for forming charge trapping gates, using an electrically insulating material for the material layer for producing the plurality of the memory gate regions; and
for the electrically insulating material, using a material that has or that can form a high density of traps.

34. The method according to claim 32, which comprises patterning the material layer by anisotropically etching the material layer such that the plurality of the memory gate regions remain as spatially separate parts of the material layer in edge regions of the recess.

35. The method according to claim 34, which comprises performing a thermal oxidation or a deposition and subsequently etching back to make an original gate insulator or an original gate oxide located between the plurality of the memory gate regions thicker than a gate insulator or a gate oxide located below the plurality of the memory gate regions.

36. The method according to claim 34, which comprises conformally depositing at least one insulation layer to embed the plurality of the memory gate regions in the insulation layer.

37. The method according to claim 36, which comprises depositing and patterning at least one material layer for the control gate configuration such that the recess is filled.

* * * * *